United States Patent [19]

Alzati et al.

[11] Patent Number: 4,739,190
[45] Date of Patent: Apr. 19, 1988

[54] MONOLITHICALLY INTEGRATABLE HIGH EFFICIENCY SWITCHING CIRCUIT

[75] Inventors: Angelo Alzati, Bollate; Antonella Lanati, Pavia, both of Italy

[73] Assignee: SGS Microelettronica SpA, Milan, Italy

[21] Appl. No.: 876,201

[22] Filed: Jun. 19, 1986

[30] Foreign Application Priority Data

Jun. 19, 1985 [IT] Italy ............................. 21216 A/85

[51] Int. Cl.[4] ...................... H03K 17/60; H03K 3/26
[52] U.S. Cl. ................................... 307/254; 307/270; 307/300
[58] Field of Search .............. 307/254, 255, 300, 289; 323/289

[56] References Cited

U.S. PATENT DOCUMENTS 3,852,620 12/1974 Milberger et al. ................ 307/300
4,318,011 3/1982 Zeis .................................... 307/255
4,369,380 1/1983 Menniti et al. .................... 307/300
4,549,055 6/1985 Stefani et al. ..................... 307/300

FOREIGN PATENT DOCUMENTS 1560354 2/1980 United Kingdom .
2053606 2/1981 United Kingdom .

Primary Examiner—Stanley D. Miller
Assistant Examiner—B. P. Davis
Attorney, Agent, or Firm—Wenderoth, Lind & Ponack

[57] ABSTRACT

A high efficiency switching circuit, which may be monolithically integrated, includes a power output transistor which is driven to switch by means of a second transistor coupled to its control terminal. Circuit components for charge extraction are connected to the base terminals of both transistors and are activated by an enabling circuit having a control terminal and an input terminal connected to the collector terminal of a third transistor having its emitter and base terminals respectively connected to the emitter terminal and the base terminal of the second transistor.

22 Claims, 5 Drawing Sheets

MONOLITHICALLY INTEGRATABLE HIGH EFFICIENCY SWITCHING CIRCUIT

BACKGROUND OF THE INVENTION

The present invention relates to control circuits for the switching of inductive loads and transistors, and in particular to a high efficiency switching circuit, which may be monolithically integrated, and may be used to drive inductive loads in high-speed printing apparatus and in switching supply devices (also called "chopper supply devices").

Switching circuits of this type generally comprise an output power transistor which is connected in series with the inductive load between the two terminals of a supply voltage source and which is driven alternately from a high voltage and low current state to a low voltage and high current state.

In the first state, the transistor is virtually an open circuit between its emitter and collector terminals (cut-off or "off" state), and in the second state, it is a short circuit (conducting or "on" state), thereby respectively preventing or enabling the flow of current through the inductive load.

The mode of operation of the transistor which comes closest to the operation of an ideal switch is that in which the transistor operates at saturation in the closed state and is cut off in the open state.

The maximum possible switching frequency of the output transistor is, in this case, essentially limited by the effects, during the passage from saturation to cut-off, of the base charge storage which took place during the conducting phase.

A cut-off transient is composed of a first stage in which the transistor remains at saturation, second stage of "quasi-saturation", in which the collector-emitter voltage begins to rise, although the collector current remains constant, and a final stage in which the collector-emitter voltage rises rapidly and the collector current falls to zero. The "quasi-saturation" stage is the stage in which the transistor dissipates the most power.

A reduction of the cut-off time would therefore be advantageous both in order to increase the maximum possible switching frequency and to improve the efficiency of the switching circuit from the power dissipation point of view by reducing the periods of time during which the operation of the output power transistor diverges from that of an ideal switch.

When the switching of the output power transistor is controlled by means of a second transistor coupled thereto, the speed of operation of the circuit also depends on the maximum switching speed of this second transistor which depends, in turn, on the effects described above of the base charge storage, particularly if it operates at saturation when it conducts.

In this case, the resulting restrictions on speed may be considerable, particularly in the case of switching circuits which may be monolithically integrated and comprising a PNP transistor used to drive the output power transistor (which is generally of an NPN type for reasons of integration known to those skilled in the art). The speed restrictions on such a PNP transistor which operates in the active zone of its operating range in its conductive state are significant, since PNP transistors have cut-off times which are longer than those of NPN transistors.

Circuits used to enable a rapid discharge of the charges stored therein when a transistor is cut off are disclosed, for example, in British Patent Specifications No. 2 053 606 and 1 560 354, published on Feb. 4, 1981 and Feb. 6, 1980, respectively.

Furthermore, U.S. Pat. No. 4,549,095 discloses a circuit aimed at reducing the cut-off time of an output power transistor driven to switch by means of a further transistor coupled to its control terminal.

In order to increase the maximum possible switching frequency and to improve the overall efficiency of the circuit, a circuit component for charge extraction is connected to the control terminals of both transistors. This component is enabled so as to extract charges only for a predetermined period of time from the beginning of cut-off of the transistors so as to avoid delays in the subsequent turn on of these transistors. This also prevents an unnecessary use of supply current needed to maintain the charge extraction circuit component in its active state when the output transistor is already completely cut off.

The duration of the enabling period, which may be predetermined at will, is therefore determined independently of the state of the two switching transistors.

SUMMARY OF THE INVENTION

The object of the present invention is to provide a switching circuit which may be monolithically integrated and whose overall efficiency is higher than that of known switching circuits.

This object may be achieved by providing a switching circuit a monolithically integratable switching circuit comprising:

a first transistor having first and second terminals and a control terminal, one of said first and second terminals being coupled to a first terminal of a supply voltage source, and the other of said first and second terminals being an output terminal of said switching circuit for coupling to a load;

a second transistor having a conductivity of a first type and having first and second terminals and a control terminal respectively connected to said first terminal of said supply voltage source, said control terminal of said first transistor and a conduction means for determining conducting and cut-off states of said second transistor; a third transistor having a conductivity of said first type and having first and second terminals and a control terminal, said first terminal and control terminal of said third transistor being respectively connected to said first terminal and control terminal of said second transistor; an enabling circuit having an input terminal which is connected to said second terminal of said third transistor, and having a control terminal and an output terminal; and a circuit means for charge extraction connected to said control terminals of said first, second and third transistors and having an actuation terminal which is connected to said output terminal of said enabling circuit; wherein said enabling circuit activates said circuit means for charge extraction only when a control signal is supplied to its control terminal and said third transistor is simultaneously conducting.

BRIEF DESCRIPTION OF THE DRAWINGS

The invention will be described in detail below, purely by way of non-limiting examples, with reference to the attached drawings, in which.

Note that like elements have identical designations in the drawing figures.

DESCRIPTION OF THE PREFERRED EMBODIMENTS

Figure 1:
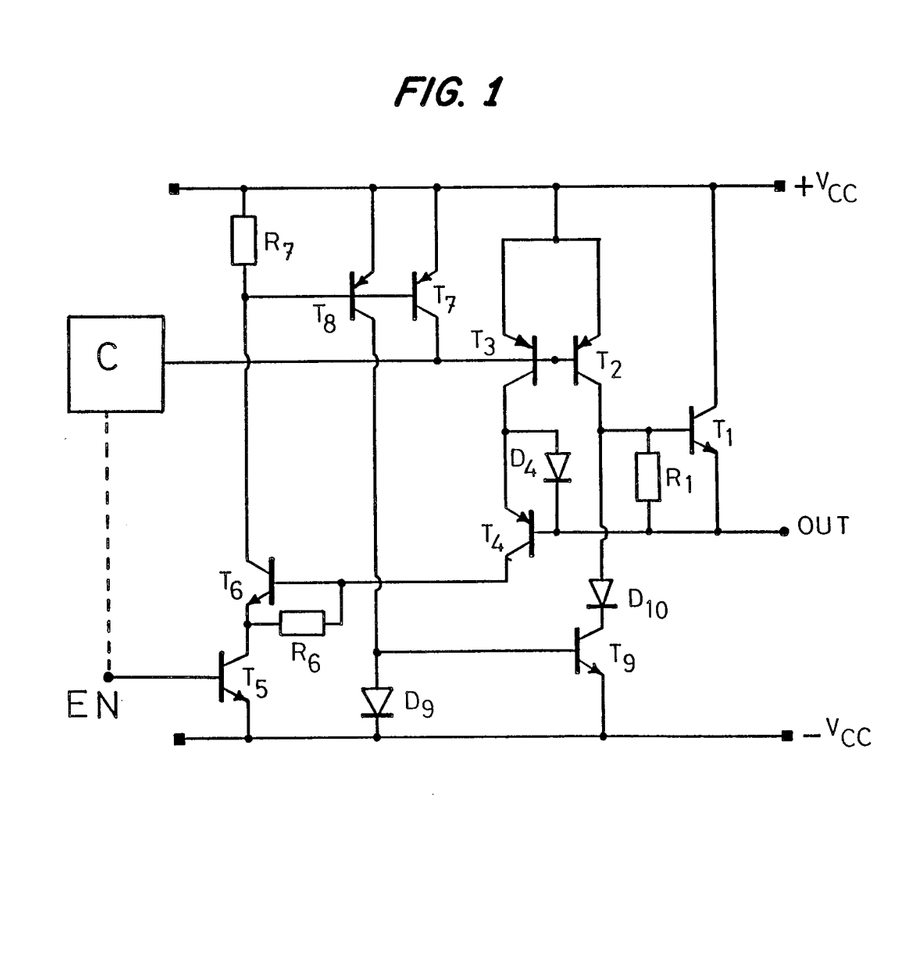
FIG. 1 is a diagram of a switching circuit in accordance with the present invention and FIGS. 2–4 are variations thereof.

A circuit diagram of a switching circuit in accordance with the present invention is shown is FIG. 1 and comprises a first bipolar NPN transistor $T_1$ which is the output transistor of the circuit and which switches a load, formed, for example, by an inductance or by another transistor.

The collector terminal of the transistor $T_1$ is connected to the positive terminal $+V_{cc}$ of a supply voltage source and its emitter terminal forms the output terminal OUT to which a load (not shown) is connected.

A resistor $R_1$ is inserted between the base and emitter terminals of the transistor $T_1$.

A second bipolar PNP transistor $T_2$ has its emitter and collector terminals respectively connected to the positive terminal $+V_{cc}$ and to the base terminal of the transistor $T_1$.

The base terminal of the transistor $T_2$ is connected to circuit components, shown in FIG. 1 by a block C, designed to determine the conducting state and the cut-off state of this transistor and formed in a way known to persons skilled in the art. Block C is discussed later with respect to FIG. 5.

The circuit, as shown in FIG. 1, then comprises third and fourth bipolar PNP transistors $T_3$ and $T_4$ and fifth and sixth bipolar NPN transistors $T_5$ and $T_6$.

The emitter terminal and the base terminal of the transistor $T_3$ are respectively connected to the emitter terminal and the base terminal of the transistor $T_2$.

The collector terminal of the transistor $T_3$ is connected to the emitter terminal of the transistor $T_4$ and to the anode of a diode $D_4$ whose cathode is connected both to the base terminal of the transistor $T_4$ and the emitter The base terminal of the transistor $T_5$, shown by the symbol EN, is connected in FIG. 1 to the block C by a dashed line. The transistor $T_5$ is in general activated by the circuit components of the block C when block C causes the cut off of the transistors $T_2$ and $T_1$. However, the control of transistor $T_5$ may be completely independent of block C. The terminal EN may even be coupled to clock C such that the control signals supplied to terminal EN also deactivate the circuit components of block C themselves.

Figure 3:
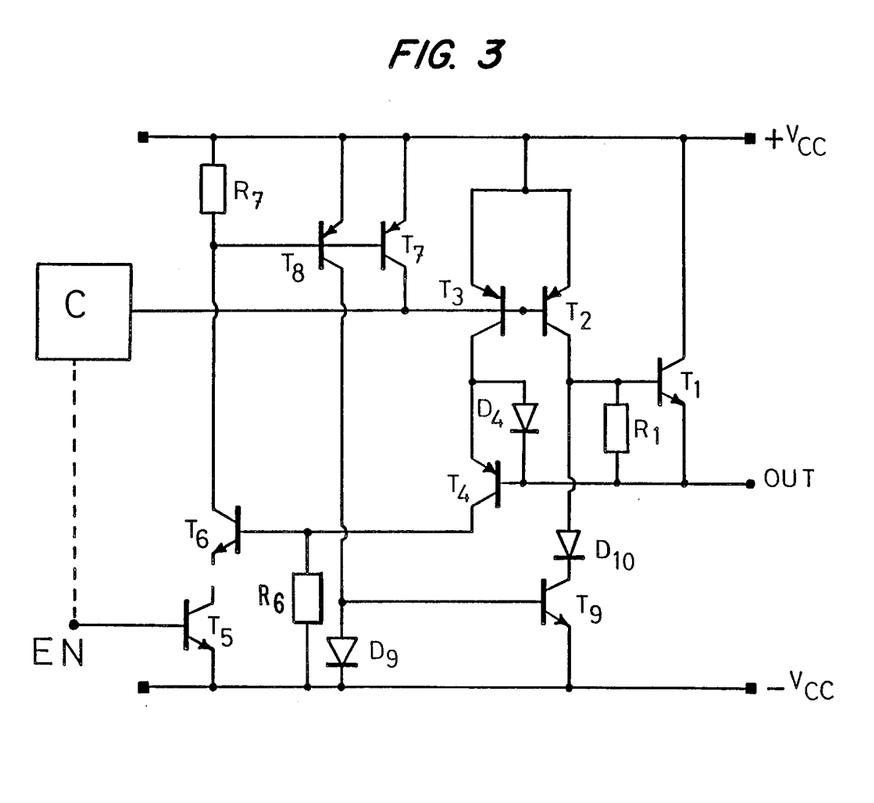
Figure 4:
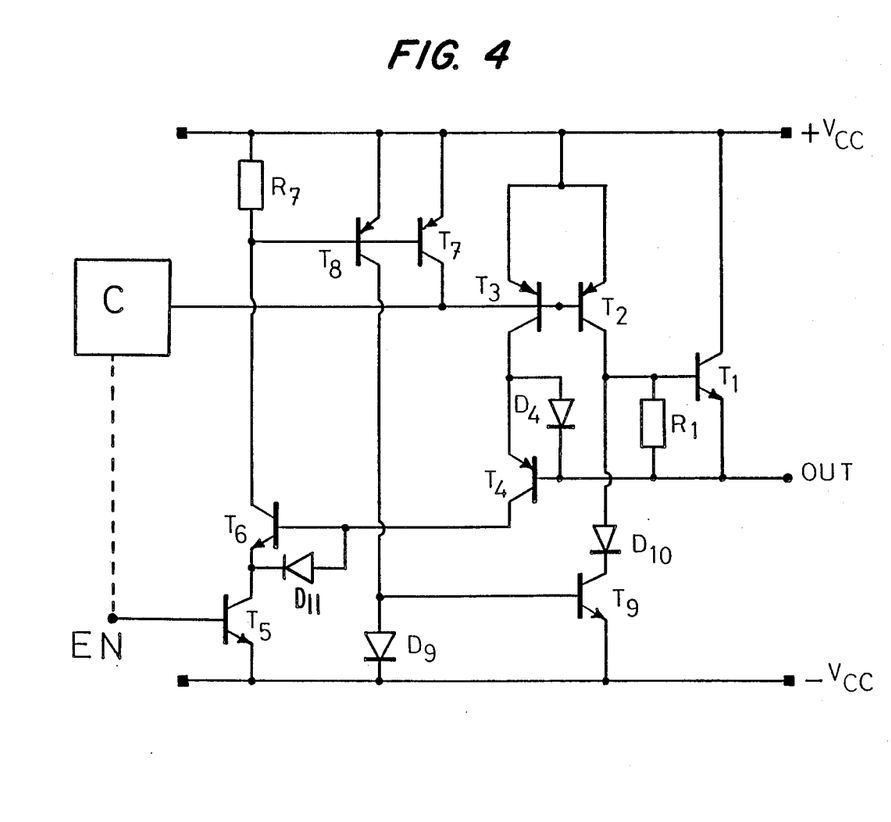
Figure 5:
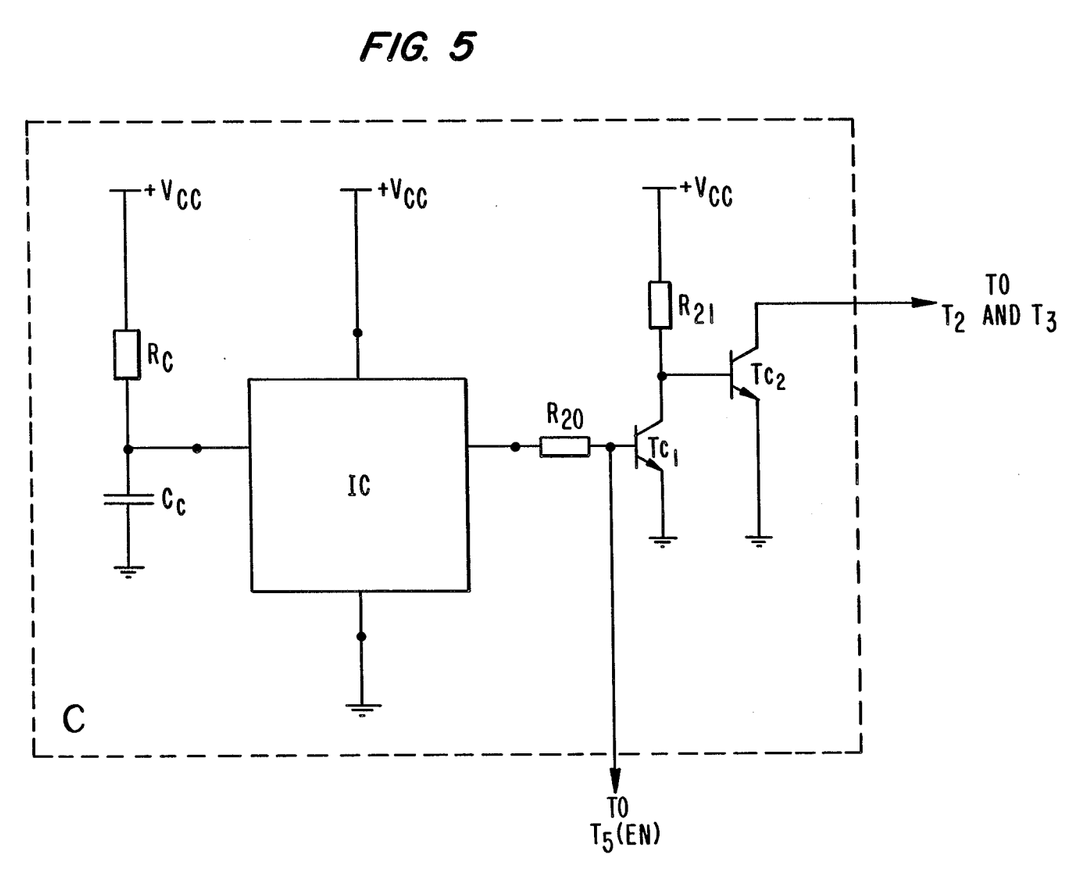
FIG. 5 is a diagram of a possible circuit for block C of FIGS. 1–4.

FIG. 5 illustrates possible circuitry which may be utilized for block C illustrated in FIGS. 1-4.

Element IC is a bipolar resettable integrated circuit timer such as part number NE555 manufactured by the Texas Instrument Corporation which, in conjunction with timing resistor $R_c$ and timing capacitor $C_c$ form a pulse generator circuit for generating the required pulses.

The output of IC may be used to directly drive the base of transistor $T_5$ through the coupling resistor $R_{20}$ as well as driving the transistor $T_{C1}$.

Transistor $T_{C1}$ in conjunction with resistor $R_{21}$ and transistor $T_{C2}$ form a driving circuit for driving the basis of transistors $T_2$ and $T_3$.

Note that transistors $T_{C1}$ and $T_{C2}$ and resistors $R_{20}$ and $R_{21}$ could easily be omitted if a different integrated circuit having a higher current handling capability is substituted for the NE555 integrated circuit.

The emitter and collector terminals of the transistor $T_5$ are respectively connected to the negative terminal $-V_{cc}$ of the supply voltage source and to the emitter terminal of the transistor $T_6$.

The collector terminal of the transistor $T_4$ is connected both to the base terminal of the transistor $T_6$ and, via a resistance $R_6$, to the collector terminal of the transistor $T_5$.

The switching circuit also comprises seventh and eighth bipolar PNP transistors $T_7$ and $T_8$ and a ninth bipolar NPN transistor $T_9$.

The base terminals of the transistors $T_7$ and $T_8$ are both connected to the collector terminal of the transistor $T_6$ and, via a resistor $R_7$, to the positive terminal $+V_{cc}$.

The emitter terminals of the transistor $T_7$ and $T_8$ are both connected to the positive terminal $+V_{cc}$.

The collector terminal of the transistor $T_7$ is connected to the base terminals of the transistors $T_2$ and $T_3$.

The collector terminal of the transistor $T_8$ is connected to the base terminal of the transistor $T_9$ and to the anode of a diode $D_9$ whose cathode is connected to the negative terminal $-V_{cc}$.

The emitter terminal of the transistor $T_q$ is connected to the negative terminal $-V_{cc}$.

The collector terminal of the transistor $T_9$ is connected to the cathode of a diode $D_{10}$ whose anode is connected to the collector terminal of the transistor $T_2$ and to the base terminal of the transistor $T_1$.

The operation of the switching circuit in accordance with the present invention, whose circuit diagram is shown in FIG. 1, will now be examined.

The circuit components for charge extraction are formed by the transistor $T_7$ whose collector terminal is connected to the base terminals of the transistors $T_2$ and $T_3$ and by the current mirror circuit structure formed by the transistor $T_8$, the diode $D_9$ and the transistor $T_9$, whose collector is connected via the diode $D_{10}$ to the base terminal of the transistor $T_1$ and to the collector terminal of the transistor $T_2$.

When these circuit components are activated, they enable a rapid discharge of the charges stored in the transistors $T_1$ and $T_2$, also absorbing all of the collector current of the transistor $T_2$.

In this way the cut off of the output transistor $T_1$ may take place very rapidly.

The diode $D_{10}$ is designed to prevent any feedback of current by the collector of the transistor $T_9$ when there is induced in an inductive load, at the time of cut-off of the transistor $T_1$, an electromotive force such as to lower the emitter and base potentials of the transistor $T_1$ below the potential of the negative terminal $-V_{cc}$. The circuit components for charge extraction are activated, via the base terminals of the transistors $T_7$ and $T_8$, by an enabling circuit formed by the transistors $T_4$, $T_5$, and $T_6$, and diode $D_4$. This circuit acts as an AND logic circuit. The emitter terminal of the transistor $T_4$ to which the anode of the diode $D_4$ is connected, forms an input terminal of this enabling circuit, while the base terminal of the transistor $T_5$ forms a control terminal EN and the collector terminal of the transistor $T_6$ forms an output terminal for the activation of the charge extraction circuit components.

The enabling circuit is designed to activate these circuit components only when the transistor $T_3$ is conducting and, at the same time, the conduction of the transistor $T_5$ is enabled via the control terminal EN. When the transistor $T_5$ is cut off, the transistor $T_6$ is also cut off, since under the normal biasing conditions, current could not, in any case, flow through it since its possible discharge path via the transistor $T_5$ is prevented. The transistor $T_4$ operates in contrast as a diode between its base and emitter terminals.

Consequently, even if the transistor $T_3$ is conducting, there is no risk of the charge extraction circuit components being activated during the conducting phase of the transistors $T_1$ and $T_2$, since the conduction of the transistor $T_5$ is only enabled by the block C when block C controls the cut off of the transistors $T_1$ and $T_2$.

The collector current of the transistor $T_3$ is also routed, via the diode $D_4$ and the emitter-base junction of the transistor $T_4$, so as to help drive the load connected to the output terminal of the circuit, with the result that no supply current is wasted.

Moreover, when the transistors $T_1$ and $T_2$ are in the cut off state, and therefore the transistor $T_3$ is also kept cut off by the block C, the transistors $T_4$ and $T_6$ are cut off since no base currents are supplied. Consequently, even if the conduction of the transistor $T_5$ were enabled, current could not flow through it since the transistor $T_6$ is in the cut-off state and the charge extraction circuit means would also remain reliably deactivated in this case and, in addition, there would be no supply current absorption.

When, however, the block C controls the switching of the transistors $T_2$ and $T_1$ from a conducting state to a cut-off state and the transistor $T_5$ is simultaneously enabled to conduct by the control terminal EN, this provides the conditions which cause the activation of the charge extraction circuit means during the cut-off transient of the transistor $T_3$ which is identical to that of the transistor $T_2$.

The transistors $T_5$ and $T_6$ and therefore $T_4$ may allow an uninterrupted flow of current as a result of which the collector current of the transistor $T_3$ may flow, as long as it is conducting, via the transistor $T_4$, partly into the base of the transistor $T_6$ and partly into the transistor $T_5$ via the resistor $R_6$. These transistors $T_5$ and $T_6$ are therefore effectively in conduction, thus activating all of the charge extraction circuit means connected to them. However, once the cut-off transient is finished and as soon as the transistor $T_2$, and therefore also the transistor $T_3$, are completely cut off, since base currents are no longer supplied thereto, the transistors $T_4$ and $T_6$ cease to conduct, irrespective of whether or not the transistor $T_5$ is enabled to conduct via the control terminal EN.

All the charge extraction circuit means are consequently deactivated until a new cut-off transient of the transistors $T_2$ and $T_1$ begins. No active component therefore remains activated and absorbing supply current.

Since the PNP transistor $T_2$ has a cut-off time which is intrinsically higher than that of the NPN transistor $T_1$, the duration of activation of the charge extraction circuit means, based exactly on the cut-off transient of the transistor $T_2$, is optimized. Moreover, the transistors $T_2$ and $T_1$, since the operation of the charge extraction circuit means is cut off once these transistors are completely cut off, are in an optimum condition for extremely rapid turn on, obtained for example using circuit solutions of the type disclosed in the copending U.S. patent application No. 795,664, which may be incorporated in the switching circuit itself.

It is evident from the above that a switching circuit in accordance with the present invention, which enables the achievement of the maximum switching speeds with no useless waste of supply current, has an overall efficiency which is greater than that which may be achieved with other known circuits.

It would also be possible, for particular applications, to make the conduction of the transistor $T_5$ independent of the block C, with the advantage that the output transistor $T_1$ could be positioned in a preferential cut-off state by means of the control terminal EN irrespective of the block C.

It is evident that a number of variants are possible without departing from the scope of the present invention.

Figure 2:
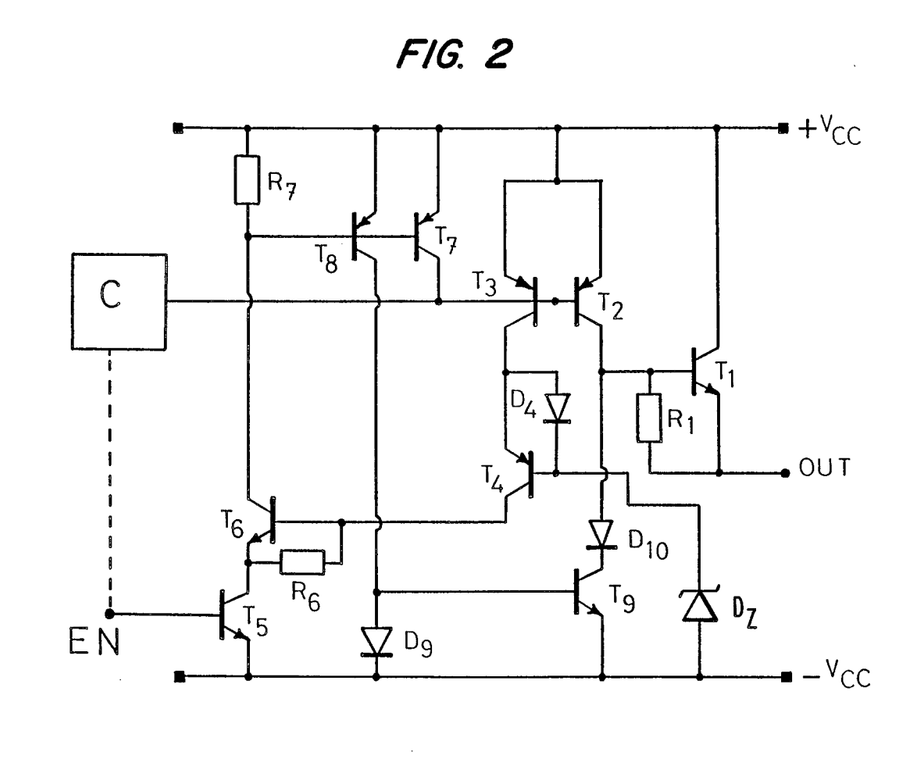

For example, as noted in FIG. 2, the base terminal of the transistor $T_4$ and the cathode of the diode $D_4$ could be connected to the negative terminal $-V_{cc}$ via a Zener diode $D_2$ and not to the emitter terminal of the transistor $T_1$.

Furthermore, as noted in FIG. 3, resistor $R_6$ could also be inserted between the base terminal of the transistor $T_6$ and the negative terminal $-V_{cc}$ instead of being inserted between the base and emitter terminals of the transistor $T_6$.

Resistor $R_6$ could also be replaced by a diode $D_{11}$ as shown in FIG. 4.

We claim:

1. A monolithically integratable switching circuit comprising:
    a first transistor having first and second terminals and a control terminal, one of said first and second terminals being coupled to a first terminal of a supply voltage source, and the other of said first and second terminals being an output terminal of said switching circuit for coupling to a load;
    a second transistor having a conductivity of a first type and having first and second terminals and a control terminal respectively connected to said first terminal of said supply voltage source, said control terminal of said first transistor and a conduction means for determining conducting and cut-off states of said second transistor; a third transistor having a conductivity of said first type and having first and second terminals and a control terminal, said first terminal and control terminal of said third transistor being respectively connected to said first terminal and control terminal of said second transistor; an enabling circuit having an input terminal which is connected to said second terminal of said third transistor, and having a control terminal and an output terminal; and a circuit means for charge extraction connected to said control terminals of said first, second and third transistors and having an actuation terminal which is connected to said output terminal of said enabling circuit; wherein said enabling circuit activates said circuit means for charge extraction only when a control signal is supplied to its control terminal and said third transistor is simultaneously conducting.

2. A switching circuit as claimed in claim 1, wherein said enabling circuit comprises fourth, fifth, and sixth transistors, each having first and second terminals and a control terminal, said fourth transistor having a conductivity of said first type and said fifth and sixth transistors having a conductivity of a second type which is opposite to that of said first type; said first terminal of said fourth transistor and said control terminal of said fifth transistor and said second terminal of said sixth transistor respectively being said input terminal, control terminal and output terminal of said enabling circuit; said first terminal of said fifth transistor being connected to a second terminal of said supply voltage source; a first diode being inserted between said first terminal and said control terminal of said fourth transistor; said control terminal of said fourth transistor being coupled to said output terminal of said switching circuit; said second terminal of said fourth transistor being connected to said control terminal of said sixth transistor and being connected, via a circuit component of a resistive type, both to said second terminal of said fifth transistor and said first terminal of said sixth transistor.

3. A switching circuit as claimed in claim 1, wherein said enabling circuit comprises fourth, fifth, and sixth transistors, each having first and second terminals and a control terminal, said fourth transistor having a conductivity of said first type and said fifth and sixth transistors having a conductivity of a second type which is opposite to that of said first type; said first terminal of said fourth transistor and said control terminal of said fifth transistor and said second terminal of said sixth transistor respectively being said input terminal, control terminal and output terminal of said enabling circuit; said first terminal of said fifth transistor being connected to a second terminal of said supply voltage source; a first diode being inserted between said first terminal and control terminal of said fourth transistor; said control terminal of said fourth transistor being coupled to said second terminal of said supply voltage source via a Zener diode; said second terminal of said fourth transistor being connected to said control terminal for said sixth transistor and being connected, via a circuit component of a resistive type, both to said second terminal of said fifth transistor and said first terminal of said sixth transistor.

4. A switching circuit as claimed in claim 2, wherein said circuit component of a resistive type is a resistor.

5. A switching circuit as claimed in claim 2, wherein said circuit component of a resistive type is a diode.

6. A switching circuit as claimed in claim 2, wherein said circuit means for charge extraction comprises seventh, eighth and ninth transistors, each having first and second terminals and a control terminal; said seventh and eighth transistors having a conductivity of said first type; said ninth transistor having a conductivity of said second type; said control terminals of said seventh and eighth transistors being connected together to form an activation terminal of said circuit means for charge extraction; said first terminals of said seventh and eighth transistors being connected to said first terminal of said supply voltage source; said first terminal of said ninth transistor being connected to said second terminal of said supply voltage source; said second terminal of said seventh transistor being connected to said control terminals of said second and third transistors; said second terminal of said eighth transistor being connected to said control terminal of said ninth transistor and, via a second diode, to said second terminal of said supply voltage source; said second terminal of said ninth transistor being connected to said control terminal of said first transistor via a third diode.

7. A switching circuit as claimed in claim 1, wherein each of said transistors comprises a bipolar transistor, said first, control and second terminals of each transistor respectively being its emitter, base and collector.

8. A switching circuit as claimed in claim 6, wherein each of said transistors comprises bipolar transistor, said first, fifth, sixth, and ninth transistors being NPN type transistors and said second, third, fourth, seventh, and eighth transistors being PNP type transistors.

9. A switching circuit as claimed in claim 3, wherein said circuit component of a resistive type is a resistor.

10. A switching circuit as claimed in claim 3, wherein said circuit component of a resistive type is a diode.

11. A switching circuit as claimed in claim 3, wherein said circuit means for charge extraction comprises seventh, eighth and ninth transistors, each having first and second terminals and a control terminal; said seventh and eighth transistors having a conductivity of said first type; said ninth transistor having a conductivity of said first type; said control terminals of said seventh and eighth transistors being connected together to form said actuation terminal of said circuit means for charge extraction; said first terminals of said seventh and eighth transistors being connected to said first terminal of said supply voltage source; said first terminal of said ninth transistor being connected to said second terminal of said supply voltage source; said second terminal of said seventh transistor being connected to said control terminals of said second and third transistors; said second terminal of said eighth transistor being connected to said control terminal of said ninth transistor and, via a second diode, to said second terminal of said supply voltage source; said second terminal of said ninth transistor being connected to said control terminal of said first transistor via a third diode.

12. A switching circuit as claimed in claim 11, wherein each of said transistors comprises a bipolar transistor, said first, fifth, sixth, and ninth transistors being NPN type transistors and said second, third, fourth, seventh, and eighth transistors being PNP type transistors.

13. A switching circuit as claimed in claim 2, wherein each of said transistors comprises a bipolar transistor, said first, control and second terminals of each transistor respectively being its emitter, base and collector.

14. A switching circuit as claimed in claim 3, wherein each of said transistors comprises a bipolar transistor, said first, control and second terminals of each transistor respectively being its emitter, base and collector.

15. A switching circuit as claimed in claim 4, wherein each of said transistors comprises a bipolar transistor, said first, control and second terminals of each transistor respectively being its emitter, base and collector.

16. A switching circuit as claimed in claim 5, wherein each of said transistors comprises a bipolar transistor, said first, control and second terminals of each transistor respectively being its emitter, base and collector.

17. A switching circuit as claimed in claim 6, wherein each of said transistors comprises a bipolar transistor, said first, control and second terminals of each transistor respectively being its emitter, base and collector.

18. A switching circuit as claimed in claim 8, wherein each of said transistors comprises a bipolar transistor, said first, control and second terminals of each transistor respectively being its emitter, base and collector.

19. A switching circuit as claimed in claim 9, wherein each of said transistors comprises a bipolar transistor, said first, control and second terminals of each transistor respectively being its emitter, base and collector.

20. A switching circuit as claimed in claim 10, wherein each of said transistors comprises a bipolar transistor, said first, control and second terminals of each transistor respectively being its emitter, base and collector.

21. A switching circuit as claimed in claim 11, wherein each of said transistors comprises a bipolar transistor, said first, control and second terminals of each transistor respectively being its emitter, base and collector.

22. A switching circuit as claimed in claim 12, wherein each of said transistors comprises a bipolar transistor, said first, control and second terminals of each transistor respectively being its emitter, base and collector.

* * * * *